US011195565B2

(12) United States Patent
Fibranz et al.

(10) Patent No.: US 11,195,565 B2
(45) Date of Patent: Dec. 7, 2021

(54) STATIC DIRECT-ACCESS MEMORY BLOCK HAVING AN INPUT DATA ADDER AND RECEIVING SENSOR

(71) Applicant: Robert Bosch GmbH, Stuttgart (DE)

(72) Inventors: Heiko Fibranz, Reutlingen (DE); Mathias Schmauke, Neustetten (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/045,655

(22) PCT Filed: May 2, 2019

(86) PCT No.: PCT/EP2019/061213
§ 371 (c)(1),
(2) Date: Oct. 6, 2020

(87) PCT Pub. No.: WO2019/215002
PCT Pub. Date: Nov. 14, 2019

(65) Prior Publication Data
US 2021/0166738 A1    Jun. 3, 2021

(30) Foreign Application Priority Data
May 7, 2018    (DE) .......................... 102018207020.2

(51) Int. Cl.
*G11C 7/10*    (2006.01)
*G11C 7/22*    (2006.01)

(52) U.S. Cl.
CPC .......... *G11C 7/1039* (2013.01); *G11C 7/1006* (2013.01); *G11C 7/1012* (2013.01);
(Continued)

(58) Field of Classification Search
CPC ... G11C 7/1039; G11C 7/1012; G11C 7/1051; G11C 7/1078; G11C 7/222; G11C 7/1006
(Continued)

(56) References Cited

U.S. PATENT DOCUMENTS 7,436,689 B2 * 10/2008 Fukushi ............... G11C 7/1006
365/117
10,832,745 B1 * 11/2020 Hush .................... G11C 7/1006
(Continued)

FOREIGN PATENT DOCUMENTS

DE    4137515 A1    5/1992
JP    S63228498 A    9/1988
(Continued)

OTHER PUBLICATIONS

International Search Report for PCT/EP2019/061213, dated Jul. 18, 2019.

*Primary Examiner* — Son L Mai
(74) *Attorney, Agent, or Firm* — Norton Rose Fulbright US LLP; Gerard Messina

(57) ABSTRACT

A static direct-access memory block for a receiving sensor, including a memory cell array, a row address decoder, a column data multiplexer, a read and write module having a read amplifier and a write driver, a control logic circuit, a data input, and a data output. The static direct-access memory block has internal memory clocking. At least one adder for adding input data coming in through the data input is integrated in the static direct-access memory block. The at least one adder is situated between the data input and the read and write module. This allows the read and write operations to be optimized and, thus, the power consumption to be decreased. A receiving sensor for a radar or lidar system, including an application-specific integrated circuit. The application-specific integrated circuit includes at least one static direct-access memory block.

9 Claims, 4 Drawing Sheets

(52) U.S. Cl.
CPC .......... *G11C 7/1051* (2013.01); *G11C 7/1078* (2013.01); *G11C 7/222* (2013.01)

(58) Field of Classification Search
USPC .......................... 365/189.05, 189.17, 189.19
See application file for complete search history.

(56) References Cited

U.S. PATENT DOCUMENTS

| | | |
|---|---|---|
| 2002/0188798 A1 | 12/2002 | Kumaki et al. |
| 2009/0228538 A1 | 9/2009 | Nagano et al. |
| 2015/0178187 A1 | 6/2015 | Sheffler et al. |
| 2016/0018511 A1 | 1/2016 | Nayyar et al. |
| 2021/0231782 A1* | 7/2021 | Henderson ............ G01S 17/931 |

FOREIGN PATENT DOCUMENTS

| | | |
|---|---|---|
| JP | H08129376 A | 5/1996 |
| JP | 2003289545 A | 10/2003 |
| WO | 2017201050 A1 | 11/2017 |

* cited by examiner

STATIC DIRECT-ACCESS MEMORY BLOCK HAVING AN INPUT DATA ADDER AND RECEIVING SENSOR

FIELD

The present invention relates to a static direct-access memory block for, in particular, a receiving sensor, including a memory cell array, a row address decoder, a column data multiplexer, a read and write module having a read amplifier and a write driver, a control logic circuit, a data input, and a data output; the static direct-access memory block having internal memory clocking. In addition, the present invention relates to a receiving sensor including at least one such static direct-access memory block.

BACKGROUND INFORMATION

In lidar and radar sensor ASIC's (application-specific integrated circuits), very large amounts of data from the receiving sensor must be processed and stored highly rapidly. Since a lot of data are produced concurrently, the input data are stored in many small direct access memory blocks. To that end, for example, up to 2000 SRAM (static random access memory) blocks of 500 data-word size, having 128 bits each, are integrated on the ASIC. In order to process the data from the receiving sensor, for example, the data are read out of the SRAM, processed, and written back again at a frequency of 500 MHz. The reading-out and the processing each take place in one storage cycle, the writing-back takes place in the following storage cycle.

From the input data, the data processing includes, for example, adding a 6-bit value to an 8-bit value present in the SRAM block. In the next cycle, the resulting 8-bit value is written back again to the same position in the SRAM block. In order not to obtain overly many individual SRAM blocks, e.g., 16 values are always combined to form a unit of input data for each SRAM block, so that a word length of 16*8 bit=128 bits is produced.

Nevertheless, in lidar systems, so many data still accrue simultaneously, that 8 SRAM blocks must be addressed concurrently.

In addition to the large amount of area required on the ASIC for the SRAM blocks, one major problem is the high power consumption and, consequently, the large amount of heat to be dissipated, since in each cycle, all 8 SRAM blocks are read or written to simultaneously.

If SRAM blocks are embedded on an ASIC, then it is standard practice for the semiconductor process developer to provide a generator, as well, which generates RAM IP (static direct-access memory block) made up of a circuit diagram and a layout, as well as other data sets, in order to integrate the block in the design. These standard SRAM blocks include a memory cell array, a row address decoder, a column data multiplexer, a read and write module having a read amplifier and a write driver, a control logic circuit, a data input, and a data output.

The column data multiplexer is necessary, since, generally, a plurality of data words are stored in one row of the memory cell array, and the column data multiplexer chooses the selected data word. In SRAM blocks, normal multiplex factors include 4, 8, or 16, depending on the size. Several data words are positioned per row, in order to obtain an SRAM block optimized with regard to area.

If an SRAM block is accessed, then the data are read or written within one cycle. However, a plurality of states are run through in the SRAM block. The operation is triggered by the rising edge of the storage cycle, but the transition into the next state takes place, using time-delay elements, for example, of a copying path, having the longest delay in comparison with the payload data.

SUMMARY

The present invention provides a static direct-access memory block. In an example embodiment of the present invention, at least one adder for adding input data coming in through the data input is integrated in the static direct-access memory block; the at least one adder being situated between the data input and the read and write module.

Since at least one adder is integrated in the static direct-access memory block, the input data may be processed more efficiently and read and write operations may be combined. The result is a reduction in the power consumption and in the generation of heat of the static direct-access memory blocks.

Advantageous further refinements of the present invention are described herein.

In one specific embodiment of the present invention, the static direct-access memory block is configured to read an original data word out of the memory cell array, to allow the at least one adder to carry out the addition of the input data, and to then write a resulting data word back into the memory cell array, in one storage cycle. Thus, in one storage cycle, the data are read out of the memory cell array, the addition is carried out, and the data are written back again into the memory cell array. This yields the following advantages:

The memory cell array is addressed only once per data processing step, instead of twice.

Since the total number of instances of access to the memory cell array and the SRAM block are cut in half, the latter may be operated at half the storage rate (for example, 250 MHz instead of 500 MHz).

While the resulting data word is written back, the corresponding memory row is already opened and has the defined voltage level of the old data (the original data word). For the writing operation, it is preferable for only the bits, whose content changes, to be reprogrammed.

Together, in particular, all three points lead to a reduction in the energy consumed, in particular, since a reduction in the necessary storage frequency with the same amount of processed input data is made possible.

In one specific embodiment of the present invention, the static direct-access memory block is configured in such a manner, that only the preloading of a memory row, address decoding with the opening of the memory row and selection of the original data word, and closing of the memory row take place in one storage cycle. This specific embodiment reduces the energy consumed even further, since fewer loading operations are necessary, in order to process the same amount of input data. Thus, the memory row does not have to be opened a second time in a following storage cycle, since it is still open when the resulting data word is written back to the memory row.

In one specific embodiment of the present invention, the static direct-access memory block is configured in such a manner, that during the writing-back of the resulting data word, the memory row is already opened and has the defined voltage level of the original data word; and during the writing-back, only the data bits, whose contents have changed between the original data word and the resulting data word, are reloaded. Consequently, unnecessary reloading operations are obviated, and additional energy is saved.

This is made possible by writing the resulting data word back in the same storage cycle as the reading-out of the original memory word.

In one preferred specific embodiment of the present invention, the at least one adder is configured in such a manner, that it checks the input data for data packets that are zero; in the current storage cycle, only the data packets, which correspond to data packets from the input data that are not equal to zero, being read out of the selected, original data word in the memory cell array, added to input data, and written back. Thus, in this specific embodiment, the adders are configured in such a manner, that they presort the input data. If data packets, whose bits are completely zero (that is, for example, all 6 bits of a data packet), are discovered in the input data, then no data processing is carried out for these data packets, and the corresponding data packets from the memory cell array are neither read out, nor added or written back later. This allows unnecessary reading and writing operations to be prevented, and the energy consumption may decrease further.

In one further specific embodiment of the present invention, the static direct-access memory block includes a second read and write module, which is situated between the memory cell array and the data output; the column data multiplexer having a multiplex factor of 1, so that all of the cells of a row of the memory cell array are read out in one storage cycle, and after the processing of the input data, the resulting data word is written back to the same row. An advantage of this specific embodiment is that if a plurality of such static direct-access memory blocks are used together in an application-specific integrated circuit, then instead of splitting up a data packet (of, for example, sensor data) into a plurality of input data (packets) for different static direct-access memory blocks, all of the input data may be transmitted to only one static direct-access memory block or at least to markedly fewer static direct-access memory blocks. The active static direct-access memory block(s) may then be read out and overwritten completely in one storage cycle. In the next storage cycle, the data to be processed may then be transmitted to other static direct-access memory block(s), and the static direct-access memory block(s), which were active in the previous storage cycle, are not used. This procedure also allows energy to be saved in comparison with the related art.

In one specific embodiment of the present invention, the static direct-access memory block includes at least 16 adders; each adder being configured to process 6 bits of data of the input data per storage cycle and to add these 6 bits of data to 8 bits of data of the original data word. The design approach of the present invention is particularly suitable for such a static direct-access memory block, since the high number of adders allows an effective reduction in the energy consumption.

In addition, the present invention provides a receiving sensor, in particular, for a radar or lidar system, including an application-specific integrated circuit; the application-specific integrated circuit having at least one static direct-access memory block according to one of the specific embodiments mentioned above. In particular, in radar or lidar systems, which often use SRAM blocks, the static direct-access memory block of the present invention may achieve a marked reduction in the energy consumption.

In one specific embodiment of the present invention, the receiving sensor includes at least two static direct-access memory blocks; in each storage cycle, only one static direct-access memory block being addressed, using input data. An advantage of this specific embodiment is that instead of splitting up the sensor data into a plurality of input data (packets) for different static direct-access memory blocks, all of the input data may be transmitted to only one static direct-access memory block or at least to markedly fewer static direct-access memory blocks. The active static direct-access memory block(s) may then be read out and overwritten completely in one storage cycle. In the next storage cycle, the sensor data to be processed may then be transmitted to other static direct-access memory block(s), and the static direct-access memory block(s), which were active in the previous storage cycle, are not used. This procedure also allows energy to be saved in comparison with the related art.

BRIEF DESCRIPTION OF THE DRAWINGS

Exemplary embodiments of the present invention are explained in greater detail below with reference to the figures.

DETAILED DESCRIPTION OF EXAMPLE EMBODIMENTS

Figure 1:
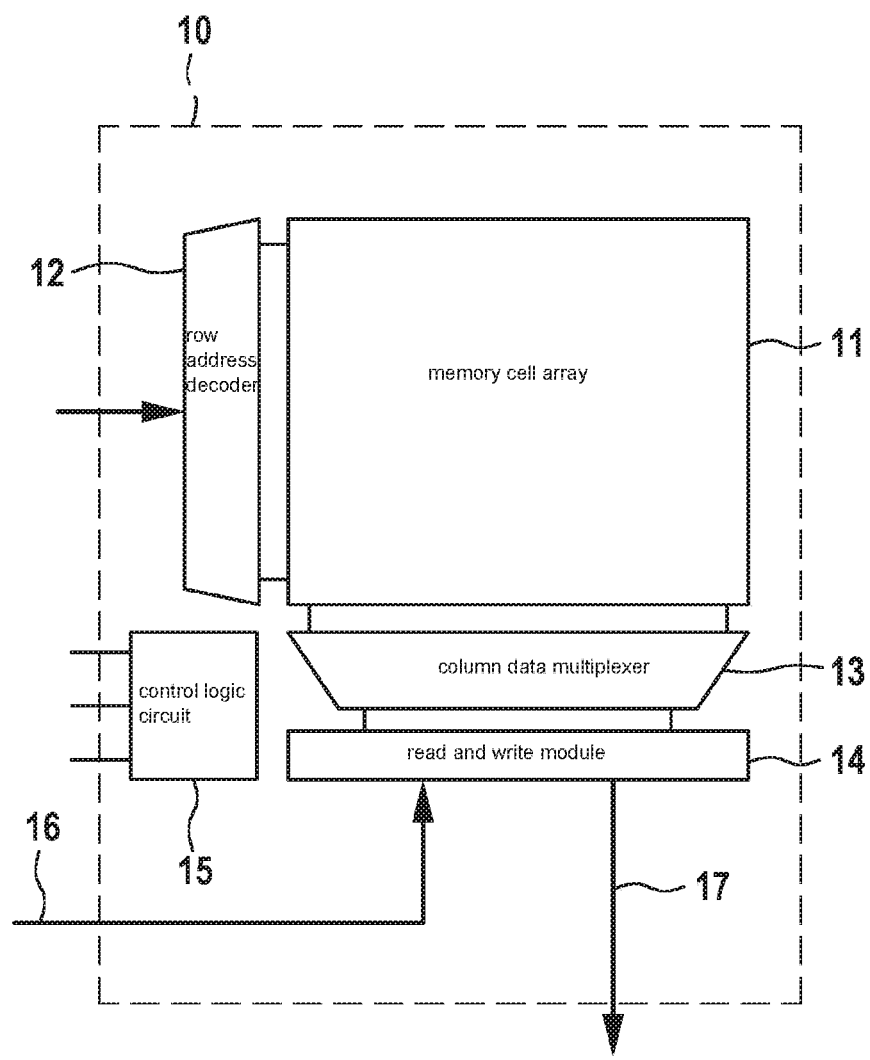
FIG. 1 shows a static direct-access memory block of the related art.

FIG. 1 shows a static direct-access memory block 10 of the related art. Static direct-access memory block (SRAM block) 10 includes a memory cell array 11, a row address decoder 12, a column data multiplexer 13, a read and write module 14 having a read amplifier and a write driver, a control logic circuit 15, a data input 16, and a data output 17. In the related art, data processing, such as the adding of sensor data, takes place outside of SRAM block 10. To that end, in one memory cycle, an original data word is selected, and the memory row is preloaded, read out and transmitted to data output 16. The memory row is closed again. In the following storage cycle, the processed data are then returned via data input 16, the previous memory row is preloaded again and opened, and the resulting data word is written back to memory cell array 11.

Figure 2:
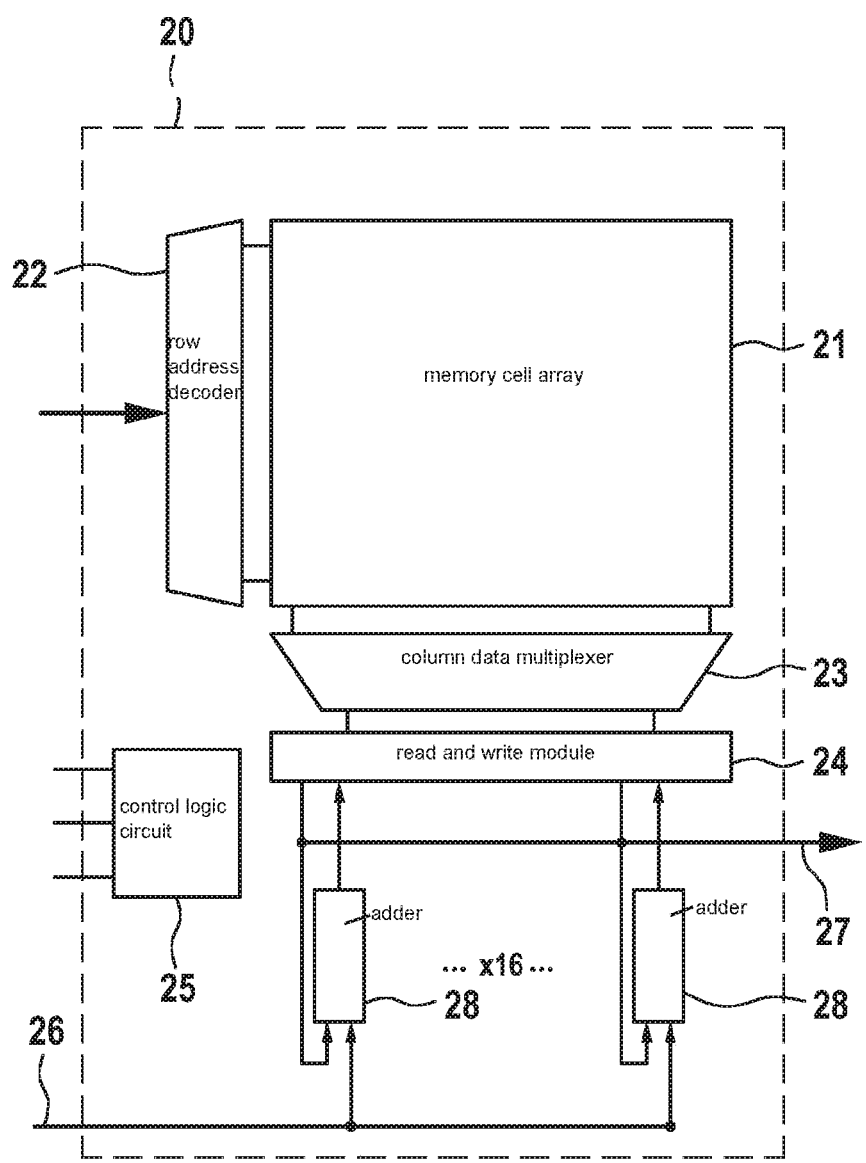
FIG. 2 shows a first specific embodiment of a static direct-access memory block according to the present invention.
Figure 3:
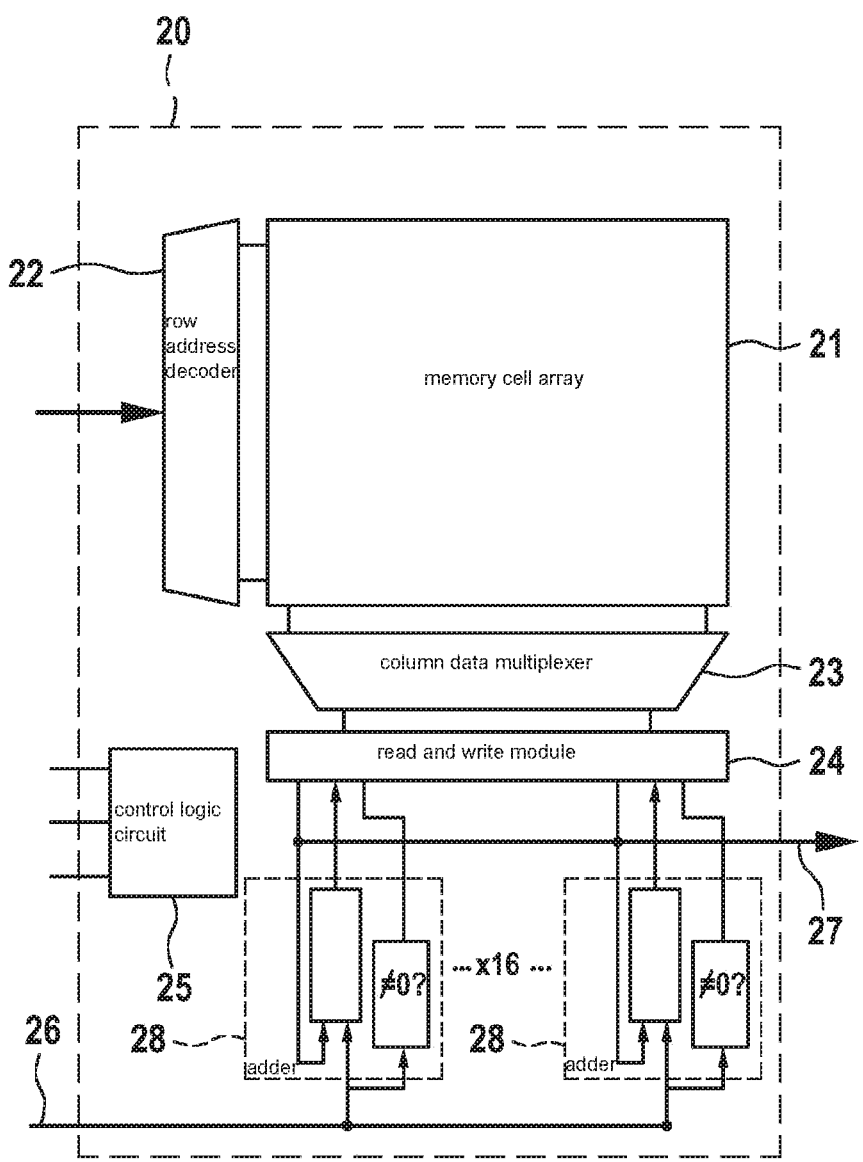
FIG. 3 shows a second specific embodiment of a static direct-access memory block according to the present invention.
Figure 4:
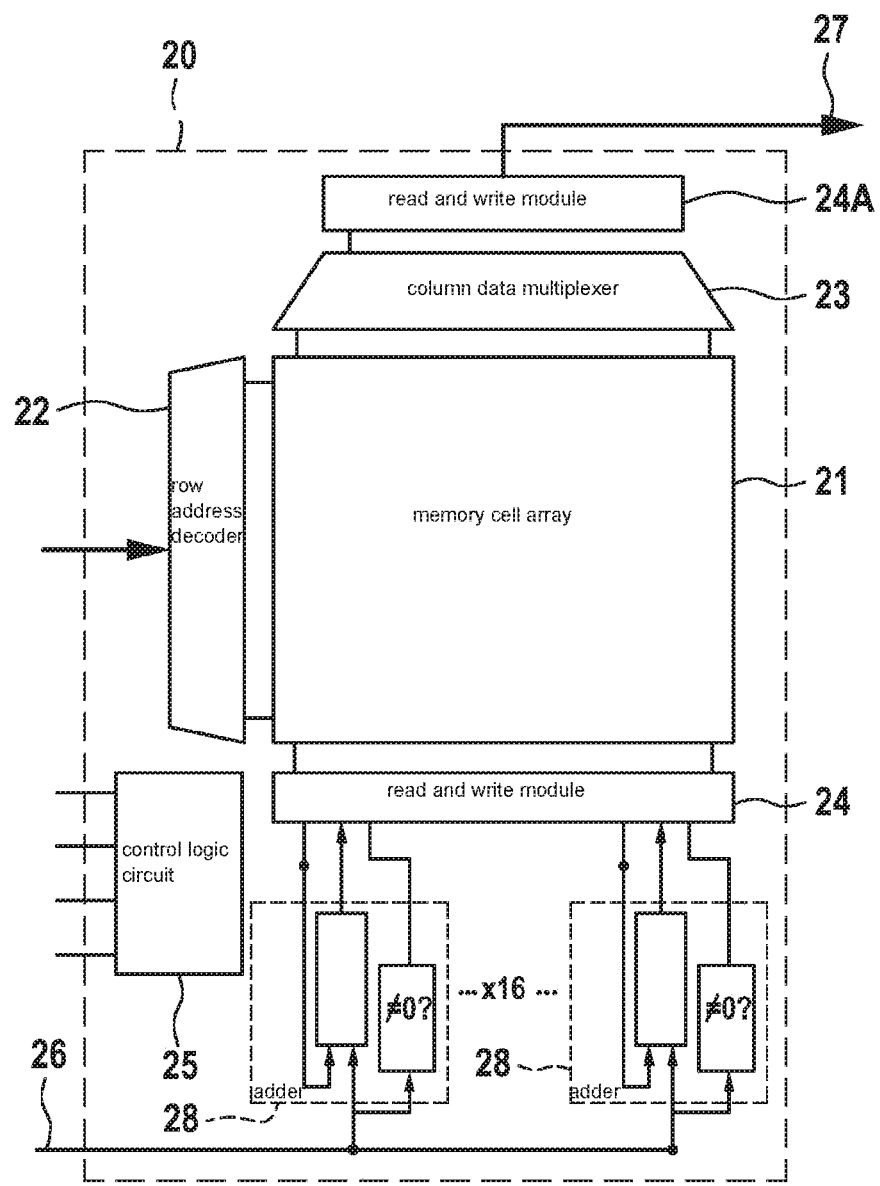
FIG. 4 shows a third specific embodiment of a static direct-access memory block according to the present invention.

An object of the present invention is to decrease the power consumption of the SRAM blocks. To that end, three instances of optimization are pursued:
  1. Combining the read, processing, and write operations.
  2. Only data, which are changing, are processed in the SRAM block.
  3. A complete memory row of the memory cell array is processed. FIGS. 2, 3 and 4 show examples of specific embodiments of the present invention, which each utilize at least one of these instances of optimization.

In FIGS. 2 through 4, corresponding features have the same reference numerals.

A first specific embodiment of a static direct-access memory block 20 according to the present invention is represented in FIG. 2. Static direct-access memory block 20 includes a memory cell array 21, a row address decoder 22, a column data multiplexer 23, a read and write module 24 having a read amplifier and a write driver, a control logic circuit 25, a data input 26, and a data output 27. In addition, static direct-access memory block 20 includes at least one adder 28 for adding input data received via data input 26; the at least one adder 28 being situated between data input 26 and read and write module 24.

In the present specific embodiments of FIGS. 2 through 4, static direct-access memory block 20 includes, in each instance, 16 adders 28. Each adder 28 may be configured, for example, to process 6 bits of data of the input data per storage cycle and to add these 6 bits of data to 8-bit data of the original data word. However, other memory configurations, different data packet sizes (other than 6-bit or 8-bit) and/or other amounts of adders 28 may be used, in order to implement the present invention.

Since adders 28 are integrated in static direct-access memory block 20, the input data may be processed more efficiently, and the number of unnecessary read and write operations may be reduced. The result is a reduction in the power consumption and in the heat generation of static direct-access memory blocks 20.

In the specific embodiment of FIG. 2, static direct-access memory block 20 is configured to read an original data word out of the memory cell array, to allow adders 28 to carry out the addition of the input data, and to then to write a resulting data word back into memory cell array 21, in one storage cycle. Thus, in one storage cycle, the data are read out of memory cell array 21, the addition is carried out, and the resulting data word is written back again into memory cell array 21. This yields the following advantages:

Memory cell array 21 is addressed only once per data processing step, instead of twice.

Since the total number of instances of access to memory cell array 21 and to SRAM block 20 are cut in half, the former may be operated at half the storage rate (for example, 250 MHz I stead of 500 MHz).

While the resulting data word is written back, the corresponding memory row in memory cell array 21 is already opened (since we are still in the same storage cycle) and has the defined voltage level of the old data (the original data word). For the writing operation, it is preferable for only the bits, whose content changes, to be overwritten.

Together, in particular, all three points lead to a reduction in the energy consumed, in particular, since a reduction in the necessary storage frequency with the same amount of processed input data is made possible.

In FIG. 2, it is apparent that adders 28 are integrated directly in SRAM block 20. After the old data are read, the read amplifiers of read and write module 24 are separated from the memory rows, and the input data are additionally added to the read data (to the original data word) and written back into memory cell array 21 (read-modify-write cycle).

A second specific embodiment of a static direct-access memory block 20 according to the present invention is represented in FIG. 3. In this case, as well, adders 28 are integrated in direct access memory block 20.

For example, 16 accumulated values per 8 bits are stored in one data word of SRAM block 10 of FIG. 1. Depending on the system, the probability, that a portion of the new input data have a value of zero, is relatively high. If an input datum is zero, then it does not need to be added to the stored value, since it does not change. Instead, the original value could be neglected to be read out, added and written back from the start. However, since a plurality of (for example, 16,) values are always stored simultaneously in an SRAM data word, then, in the related art, the entire data word must be read out anyway, since the probability of all 16 input data values being zero is very low.

However, if the present invention provides for adders 28 to be integrated in SRAM block 20, as shown in FIG. 3, the input data may be checked, and the corresponding bits in the data word may only be read out and processed, if they are not equal to zero. In this specific embodiment, this is executed by adders 28. In this manner, the power consumption may be reduced by the portion, which it costs to read out and write back the original data value (that would not have changed due to the processing).

Thus, adders 28 are configured in such a manner, that they check the input data for bits, which are zero; in the current storage cycle, only bits, which correspond to bits from the input data that are not equal to zero, are read out of the selected, original data word in memory cell array 21, added to input data, and written back.

FIG. 4 shows a third specific embodiment of a static direct-access memory block 20 according to the present invention. In this case, as well, adders 28 are integrated in direct access memory block 20.

Here, static direct-access memory block 20 includes a second read and write module 24A, which is situated between memory cell array 21 and data output 27. Column data multiplexer 23 has a multiplex factor of 1, so that all of the cells of a memory row of memory cell array 21 are read out in one storage cycle, and after the processing of the input data, the resulting data word is written back to the same row.

When a plurality of such static direct-access memory blocks 20 are used together in an application-specific integrated circuit, then, instead of splitting up a data packet (of, for example, sensor data) into a plurality of input data (packets) for different static direct-access memory blocks 20, all of the input data may be transmitted to only one static direct-access memory block 20 or at least to markedly fewer static direct-access memory blocks 20. Active static direct-access memory block(s) 20 may then be read out and overwritten completely in one storage cycle. In the next storage cycle, the data to be processed may then be transmitted to (an)other static direct-access access memory block(s) 20, and the static direct-access memory block(s) 20, which was/were active in the previous storage cycle, is/are not used. This procedure also allows energy to be saved in comparison with the related art.

In the selection of a static direct-access memory block 20, it has been shown that at the same memory size, the electricity consumed decreases if a low multiplex factor is selected. An explanation for this is that the data word rows in the memory rows are shorter and fewer selection transistors must be activated.

A receiving sensor of the present invention, in particular, for a radar or lidar system, includes an application-specific integrated circuit. The application-specific integrated circuit includes at least one, preferably, a plurality of, static direct access memory block(s) 20 according to one of the specific embodiments described.

In such a receiving sensor, for example, 8 SRAM blocks 20 may concurrently process 16 sensor data (input data) each. Using the specific embodiment of FIG. 4, these 8*16 sensor data may now be processed in one SRAM block 20. To that end, in addition to the normal data path, a second read and write module 24A, which is situated between memory cell array 21 and data output 27, is integrated in SRAM block 20. Column data multiplexer 23 has a multiplex factor of 1 (thus, in this case, column data multiplexer 23 may also be omitted), so that all of the cells of a row of memory cell array 21 are read out in one storage cycle, and after the processing of the input data, the resulting data word is written back to the same row. The normal data path may then be optimized for the processing, for example, to a word length of 64 bits, and in order to always read out 8 accumulated values.

Then, for example, instead of 8 SRAM blocks 20, only one SRAM block 20 may be addressed per storage cycle. In this SRAM block 20, during the processing of the sensor data, all of the memory cells of a row are processed; thus, no unneeded memory cells are addressed. This specific embodiment may be combined with the specific embodiment of FIG. 3, so that the original values, which are not changed, are also not read out, processed, and written back.

What is claimed is:

1. A static direct access memory block for a receiving sensor, comprising:
    a memory cell array;
    a row address decoder;
    a column data multiplexer;
    a read and write module having a read amplifier and a write driver;
    a control logic circuit;
    a data input and a data output;
    internal memory clocking; and
    at least one adder, configured to add input data coming in through a data input of the static direct-access memory device and integrated in the static direct-access memory block, the at least one adder being situated between the data input and the read and write module.

2. The static direct-access memory block as recited in claim 1, wherein the static direct-access memory block is configured to read an original data word out of the memory cell array, to allow the at least one adder to carry out the addition of the input data, and to then write a resulting data word back into the memory cell array, in one storage cycle.

3. The static direct-access memory block as recited in claim 2, wherein the static direct-access memory block is configured in such a manner, that a preloading of a memory row, an address decoding with the opening of the memory row and selection of the original data word, and a closing of the memory take place in one storage cycle.

4. The static direct-access memory block as recited in claim 3, wherein the static direct-access memory block is configured in such a manner, that during the writing-back of the resulting data word, the memory row is already opened and has a defined voltage level of the original data word, and during the writing-back, only the data bits, whose contents have changed between the original data word and the resulting data word, are reloaded.

5. The static direct-access memory block as recited in claim 3, wherein the at least one adder is configured in such a manner that it checks the input data for data packets that are zero, and in a current storage cycle, only the data packets, which correspond to data packets from the input data that are not equal to zero, are read out of the selected, original data word in the memory cell array, added to input data, and written back.

6. The static direct-access memory block as recited in claim 2, wherein the static direct-access memory block includes a second read and write module, which is situated between the memory cell array and a data output of the static direct-access memory block, and the column data multiplexer has a multiplex factor of 1, so that all of the cells of a row of the memory cell array are read out in one storage cycle, and after processing of the input data, the resulting data word is written back to the same row.

7. The static direct-access memory block as recited in claim 2, wherein the static direct-access memory block includes at least 16 adders, and each of the adders is configured to process 6 bits of data of the input data per storage cycle and to add the 6 bits of data to 8-bit data of the original data word.

8. A receiving sensor for a radar or lidar system, comprising:
    an application-specific integrated circuit;
    wherein the application-specific integrated circuit has at least one static direct- access memory block, the static direct-access memory block including:
        a memory cell array,
        a row address decoder,
        a column data multiplexer,
        a read and write module having a read amplifier and a write driver,
        a control logic circuit,
        a data input and a data output,
        internal memory clocking, and
        at least one adder, configured to add input data coming in through a data input of the static direct-access memory device and integrated in the static direct-access memory block, the at least one adder being situated between the data input and the read and write module.

9. The receiving sensor as recited in claim 8, wherein the receiving sensor includes at least two static direct-access memory blocks, wherein in each storage cycle, only one of the static direct-access memory blocks is addressed, using the input data.

* * * * *